United States Patent
Chen et al.

(10) Patent No.: US 11,069,401 B2
(45) Date of Patent: *Jul. 20, 2021

(54) MEMORY WITH SYMMETRIC READ CURRENT PROFILE AND READ METHOD THEREOF

(71) Applicant: Taiwan Semiconductor Manufacturing Co., Ltd., Hsinchu (TW)

(72) Inventors: Yuhsiang Chen, Zhubei (TW); Shao-Yu Chou, Chu Pei (TW); Chun-Hao Chang, Taichung (TW); Min-Shin Wu, Taipei (TW); Yu-Der Chih, Hsin-chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,069

(22) Filed: Jun. 8, 2020

(65) Prior Publication Data
US 2020/0302998 A1    Sep. 24, 2020

Related U.S. Application Data

(63) Continuation of application No. 16/390,517, filed on Apr. 22, 2019, now Pat. No. 10,706,918, which is a
(Continued)

(51) Int. Cl.
| | |
|---|---|
| *G11C 11/41* | (2006.01) |
| *G11C 11/419* | (2006.01) |
| *G11C 11/418* | (2006.01) |
| *G11C 11/409* | (2006.01) |

(Continued)

(52) U.S. Cl.
CPC .......... *G11C 11/419* (2013.01); *G11C 11/418* (2013.01); *G11C 7/1012* (2013.01);
(Continued)

(58) Field of Classification Search
None
See application file for complete search history.

(56) References Cited

U.S. PATENT DOCUMENTS

| 4,839,860 A | * | 6/1989 | Shinoda | .............. | G06F 11/1008 |
|---|---|---|---|---|---|
| | | | | | 365/104 |
| 4,941,129 A | | 7/1990 | Oshima et al. | | |
| (Continued) | | | | | |

OTHER PUBLICATIONS

U.S. Appl. No. 16/390,517, filed Apr. 22, 2019.

*Primary Examiner* — Tan T. Nguyen
(74) *Attorney, Agent, or Firm* — Birch, Stewart, Kolasch & Birch, LLP

(57) ABSTRACT

Memories are provided. A memory includes a first memory array, a second memory array, and a read circuit. The first memory array is configured to store main data. The second memory array is configured to store complement data that is complementary to the main data. The read circuit includes a first sense amplifier, a second sense amplifier and an output buffer. The first sense amplifier is configured to provide a first sensing signal according to a reference signal and first data of the main data corresponding to a first address signal. The second sense amplifier is configured to provide a second sensing signal according to the reference signal and second data of the complement data corresponding to the first address signal. The output buffer is configured to provide one of the first sensing signal and the second sensing signal as an output according to a control signal.

20 Claims, 9 Drawing Sheets

Related U.S. Application Data continuation of application No. 15/619,084, filed on Jun. 9, 2017, now Pat. No. 10,269,420.

(60) Provisional application No. 62/433,538, filed on Dec. 13, 2016.

(51) Int. Cl.
  *G11C 11/413* (2006.01)
  *G11C 7/10* (2006.01)

(52) U.S. Cl.
  CPC .......... *G11C 7/1051* (2013.01); *G11C 11/409* (2013.01); *G11C 11/413* (2013.01)

(56) References Cited

U.S. PATENT DOCUMENTS

| | | |
|---|---|---|
| 5,377,154 A | 12/1994 | Takasugi |
| 5,544,122 A | 8/1996 | Mizukami et al. |
| 5,561,633 A | 10/1996 | Yamano |
| 5,819,305 A | 10/1998 | Nixon |
| 6,151,271 A | 11/2000 | Lee |
| 6,169,684 B1 | 1/2001 | Takahashi et al. |
| 6,266,792 B1 | 7/2001 | Wada et al. |
| 6,574,163 B2 | 6/2003 | Maeda |
| 7,286,416 B2 | 10/2007 | Ooishi et al. |
| 10,269,420 B2 * | 4/2019 | Chen .................... G11C 11/419 |
| 10,706,918 B2 * | 7/2020 | Chen .................... G11C 11/419 |
| 2001/0033514 A1 * | 10/2001 | Takata .................... G11C 7/14 |
| | | 365/189.07 |
| 2004/0196696 A1 * | 10/2004 | Yamauchi .............. G11C 16/28 |
| | | 365/185.2 |
| 2010/0260002 A1 | 10/2010 | Chen et al. |
| 2011/0063935 A1 | 3/2011 | Yoshida et al. |
| 2015/0243345 A1 * | 8/2015 | Kim .................. G11C 11/40615 |
| | | 365/189.05 |
| 2015/0248923 A1 | 9/2015 | Lin et al. |
| 2015/0279462 A1 | 10/2015 | Iyer et al. |
| 2017/0285998 A1 | 10/2017 | Mathuria et al. |

* cited by examiner

MEMORY WITH SYMMETRIC READ CURRENT PROFILE AND READ METHOD THEREOF

CROSS REFERENCE TO RELATED APPLICATIONS

This Application is a Continuation of U.S. application Ser. No. 16/390,517, filed on Apr. 22, 2019, now U.S. Pat. No. 10,706,918, which is a Continuation of U.S. application Ser. No. 15/619,084, filed on Jun. 9, 2017, now U.S. Pat. No. 10,269,420, which claims priority of U.S. Provisional Application No. 62/433,538, filed on Dec. 13, 2016, the entirety of which are incorporated by reference herein.

BACKGROUND

Memories are commonly used in integrated circuits. For example, a static random access memory (SRAM) is a volatile memory, and is used for electronic applications where high speed, low power consumption and simple operations are applicable. Embedded SRAM is particularly popular in high-speed communications, image processing and system on chip (SOC) applications. SRAM has the advantageous feature of being able to hold data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
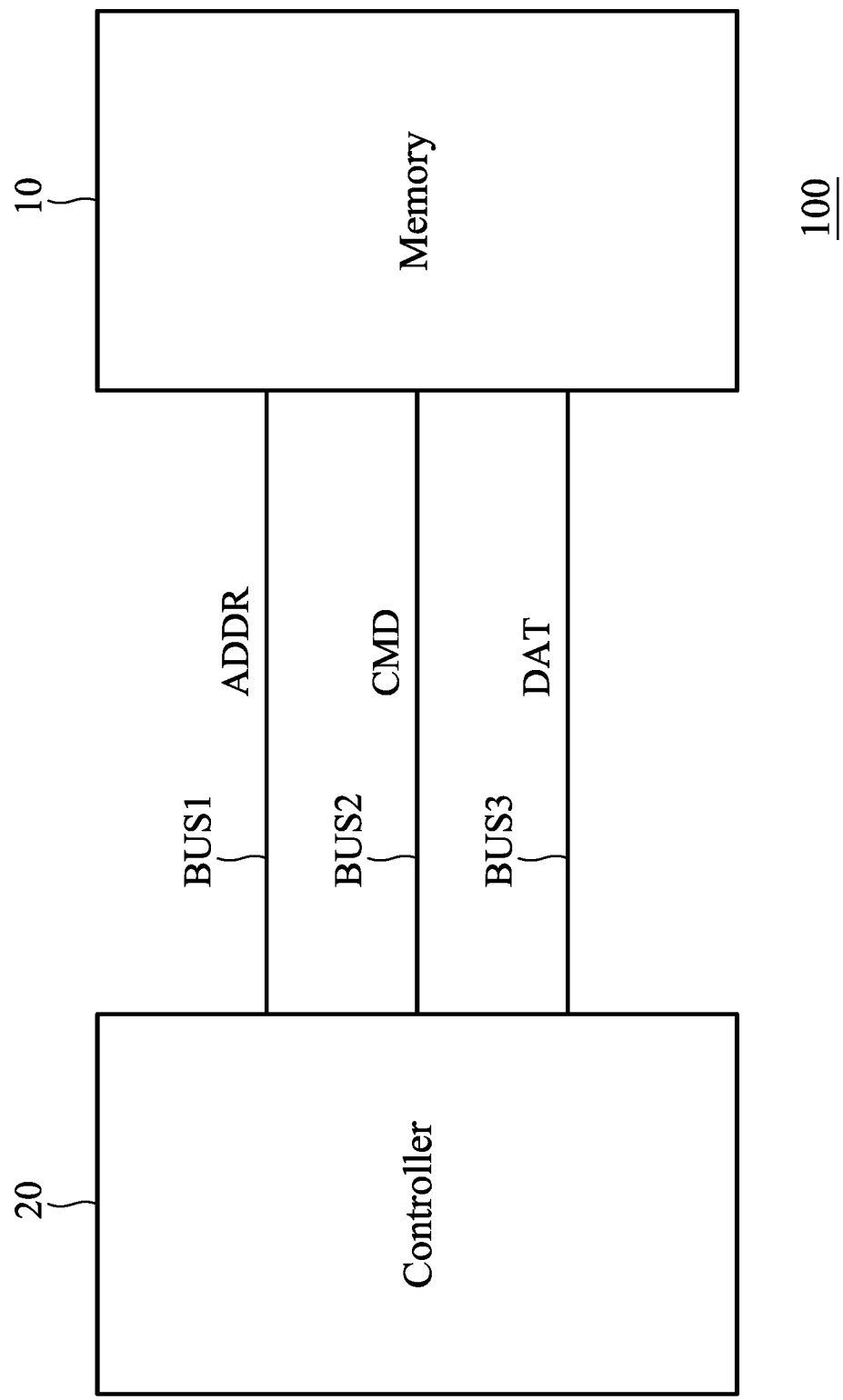
FIG. 1 shows an integrated circuit (IC), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows an integrated circuit (IC) 100, in accordance with some embodiments of the disclosure. The IC 100 includes an embedded memory 10 and a controller 20. The memory 10 may be a volatile memory (e.g. RAM), or a non-volatile memory (e.g. ROM).

In some embodiments, the controller 20 communicates with the memory 10 via a plurality of buses BUS1, BUS2, and BUS3. The bus BUS1 is an address bus for providing an access address signal ADDR from the controller 20 to the memory 10. The bus BUS2 is a command bus for providing a command signal CMD from the controller 20 to the memory 10. The bus BUS3 is a data bus for transferring a data signal DAT between the controller 20 and the memory 10. In order to simplify the description, only the buses BUS1, BUS2, and BUS3 are illustrated in FIG. 1, and other related signals between the controller 20 and the memory 10 are omitted, such as a clock signal, a chip select signal, and so on.

Figure 2:
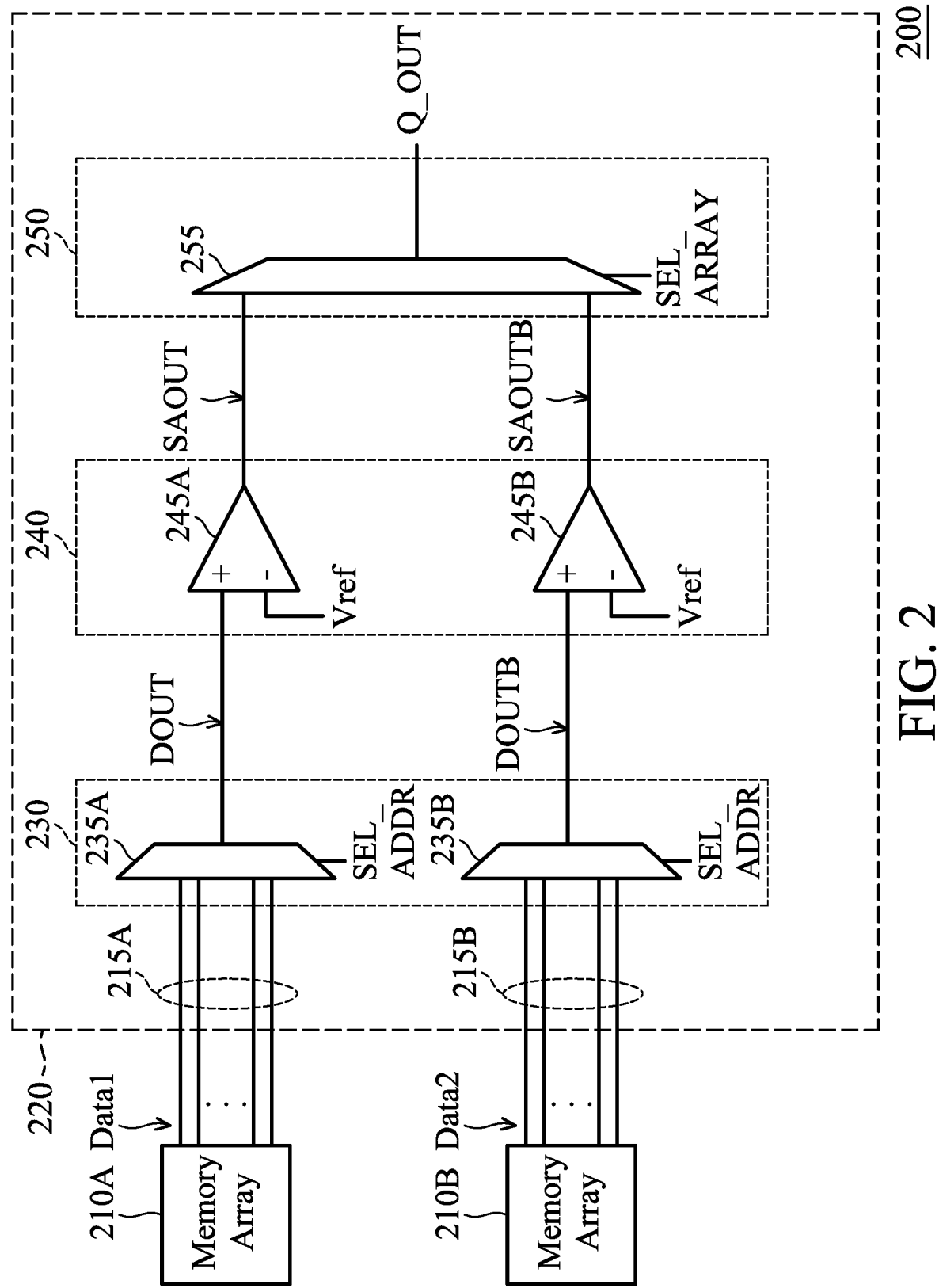
FIG. 2 shows a memory, in accordance with some embodiments of the disclosure.

FIG. 2 shows a memory 200 illustrating an exemplified block diagram of the memory 10 of FIG. 1, in accordance with some embodiments of the disclosure. The memory 200 is an embedded memory powered by a power supply VDD for the IC 100. Furthermore, the memory 200 may be a volatile memory or a non-volatile memory controlled by the controller 20 of the IC 100.

The memory 200 includes a memory array 210A, a memory array 210B and a read circuit 220. The memory array 210A is formed by a plurality of first memory cells disposed in rows and columns, and the memory array 210B is formed by a plurality of second memory cells disposed in rows and columns. In some embodiments, the number of first memory cells in the memory array 210A is identical to the number of second memory cells in the memory array 210B.

It should be noted that one of the memory arrays 210A or 210B is a main array capable of storing main data, and the other memory array 210A or 210B is an auxiliary array capable of storing complement data that is complementary to the main data. In some embodiments, if the memory array 210A is a main array, the memory array 210B is an auxiliary array. Conversely, if the memory array 210B is a main array, the memory array 210A is an auxiliary array.

The read circuit 220 is capable of simultaneously reading data from the memory array 210A and the memory array 210B in response to an access address signal ADDR from the controller 20. The read circuit 220 includes a decoding circuit 230, a sensing circuit 240 and an output buffer 250. In the read circuit 220, the decoding circuit 230 is coupled to the memory array 210A and the memory array 210B via a first bus 215A and a second bus 215B, respectively. The sensing circuit 240 is coupled between the decoding circuit 230 and the output buffer 250.

The decoding circuit 230 includes a decoder 235A and a decoder 235B. In some embodiments, the decoders 235A and 235B are selectors or multiplexers (MUXs). The decoder 235A is coupled to the memory array 210A via the first bus 215A, and the first bus 215A is formed by a plurality of bit lines coupled to the first memory cells of the memory array 210A. Similarly, the decoder 235B is coupled to the memory array 210B via the second bus 215B, and the second bus 215B is formed by a plurality of bit lines coupled to the second memory cells of the memory array 210B. In response to the access address signal ADDR from the controller 20, the memory array 210A provides data Data1 corresponding to the access address signal ADDR to the decoder 235A, and the memory array 210B provides data Data2 corresponding to the access address signal ADDR to the decoder 235B. It should be noted that the data Data1 from the memory array 210A is complementary to the data Data2 from the memory array 210B.

In response to an address signal SEL_ADDR corresponding to the access address signal ADDR from the controller 20, the decoder 235A selectively provides a signal DOUT of the data Data1 from a specific bit line of the first bus 215A to the sensing circuit 240. Simultaneously, the decoder 235B selectively provides a signal DOUTB of the data Data2 from a specific bit line of the second bus 215B to the sensing circuit 240. Similarly, the signal DOUT is complementary to the signal DOUTB. In some embodiments, the address signal SEL_ADDR is provided by the controller 20. In some embodiments, the address signal SEL_ADDR is provided by the other circuit (not shown) of the memory 200.

The sensing circuit 240 includes a sense amplifier 245A and a sense amplifier 245B. The sense amplifier 245A has a first input terminal (e.g. a non-inverting input terminal "+") coupled to the decoder 235A, a second input terminal (e.g. an inverting input terminal "−") for receiving a reference signal Vref, and an output terminal coupled to the output buffer 250. A voltage difference between the signal DOUT and the reference signal Vref is amplified by the sense amplifier 245A to provide a sensing signal SAOUT. Similarly, the sense amplifier 245B has a first input terminal (e.g. a non-inverting input terminal "+") coupled to the decoder 235B, a second input terminal (e.g. an inverting input terminal "−") for receiving the reference signal Vref, and an output terminal coupled to the output buffer 250. A voltage difference between the signal DOUTB and the reference signal Vref is amplified by the sense amplifier 245B to provide a sensing signal SAOUTB. Similarly, the sensing signal SAOUT is complementary to the sensing signal SAOUTB.

In the sensing circuit 240, the sense amplifiers 245A and 245B have the same circuit and configuration. It should be noted that the sense amplifiers 245A and 245B are used as an example to illustrate simple schematic diagram, and is not meant to limit the disclosure. Any sense amplifier capable of amplifying a small difference in the voltage or current level of a bit line can be used in the sensing circuit 240.

The output buffer 250 includes a selector 255. The selector 255 is coupled to the sense amplifiers 245A and 245B of the sensing circuit 240. In some embodiments, the selector 255 is a multiplexer. In response to a control signal SEL_ARRAY which indicates which memory array is a main array, the selector 255 selectively provides the sensing signal SAOUT from the sense amplifier 245A or the sensing signal SAOUTB from the sense amplifier 245B as an output Q_OUT. For example, if the memory array 210A is configured as a main array for storing the main data and the memory array 210B is configured as an auxiliary array for storing the complement data according to memory configurations of the main array and the auxiliary array, the control signal SEL_ARRAY controls the selector 255 to provide the sensing signal SAOUT as the output Q_OUT in response to an access address signal ADDR. Conversely, if the memory array 210B is configured as a main array and the memory array 210A is configured as an auxiliary array, the control signal SEL_ARRAY controls the selector 255 to provide the sensing signal SAOUTB as the output Q_OUT. In some embodiments, the control signal SEL_ARRAY is provided by the controller 20. In some embodiments, the control signal SEL_ARRAY is provided by the other circuit (not shown) of the memory 200. Therefore, according to the access address signal ADDR, the signal DOUT of the data Data1 from the memory array 210A and the signal DOUTB of the data Data2 from the memory array 210B are simultaneously sensed to obtain the sensing signals SAOUT and SAOUTB, and the sensing signal SAOUT or SAOUTB is provided as the output Q_OUT according to the control signal SEL_ARRAY. In some embodiments, the sensing signal SAOUT or SAOUTB to be provided as the output Q_OUT is the data stored in the main array.

Furthermore, the memory 200 further includes an output circuit (not shown) coupled to the output buffer 250. The output circuit is capable of providing a data signal DAT (e.g. DAT of FIG. 1) to the controller 20 when each bit of the main data corresponding to the access address signal ADDR is output by the output buffer 250.

Figure 3:
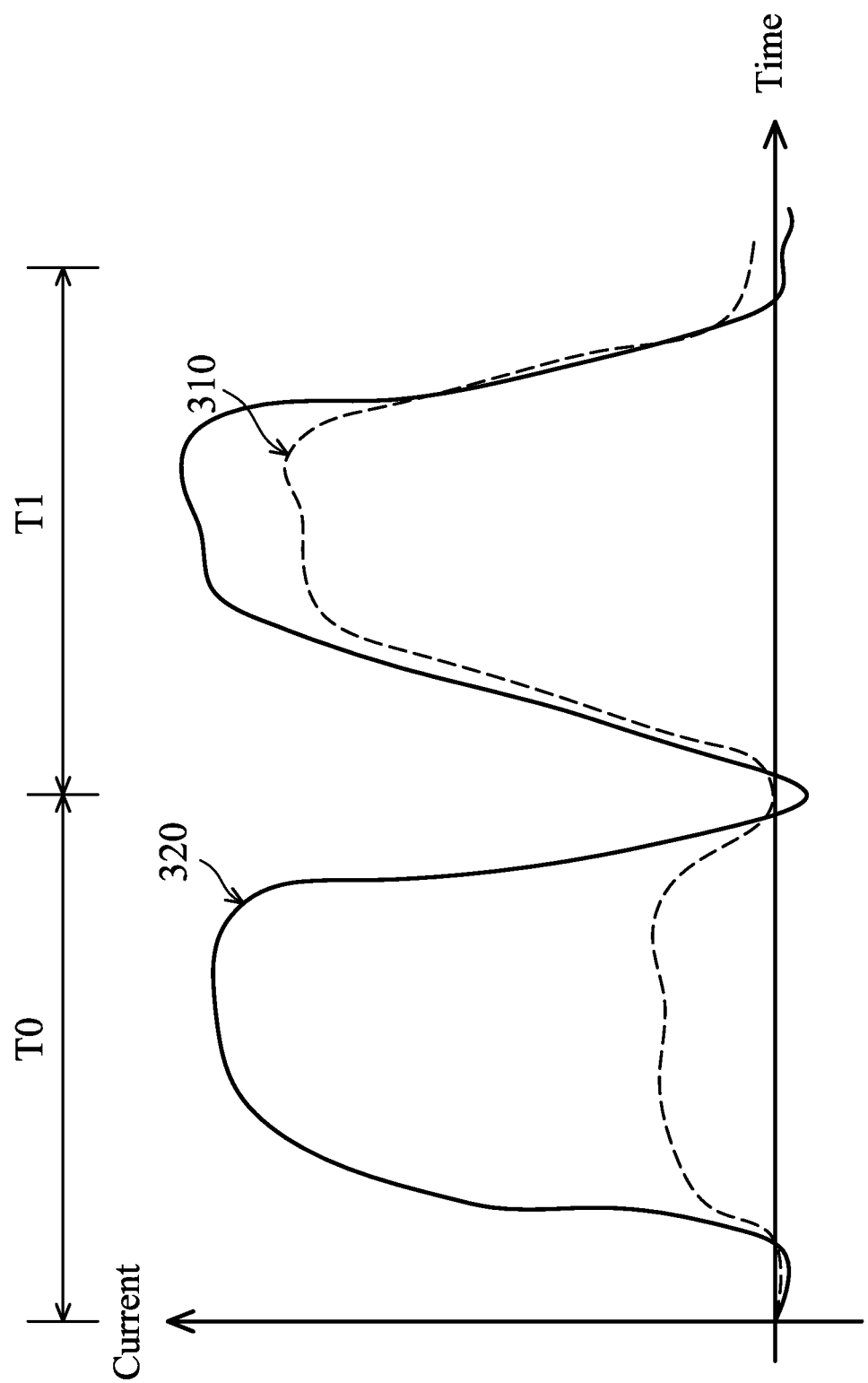
FIG. 3 shows an example diagram illustrating current consumption of the memory of FIG. 2.

FIG. 3 shows an example diagram illustrating current consumption of the memory 200 of FIG. 2. In the embodiment, current consumption of the memory 200 is based on the power supply VDD. In FIG. 3, current profile 310 and current profile 320 are shown. Current profile 310 represents the current consumption of a memory having a single memory array, and current profile 320 represents the current consumption of the memory 200 of FIG. 2 having the memory arrays 210A and 210B.

For illustration, in a memory having a single memory array, a bit "0" is read from the single memory array in a time period T0, and a bit "1" is read from the single memory array in a time period T1. In the current profile 310, current consumption for reading a bit "0" from the single memory array and current consumption for reading a bit "1" from the single memory array are different, i.e. the current consumption of the time period T0 is different from the current consumption of the time period T1 for the current profile 310. Specifically, the current consumption for reading a bit "0" from the single memory array is smaller than the current consumption for reading a bit "1" from the single memory array, i.e. the current profile 310 is asymmetric. Due to the fact that the current consumption for reading a bit "1" or "0" can be distinguished, when the data stored in the single memory array of the memory is being read, hackers may obtain stored data by monitoring the power supply of the memory, e.g. probing the current profile of the memory.

For further illustration, in the memory 200 of FIG. 2, a bit "0" is read from a main array of the memory 200 and a bit "1" is read from an auxiliary array of the memory 200 in a time period T0 in FIG. 3. Furthermore, a bit "1" is read from the main array and a bit "0" is read from the auxiliary array of the memory 200 in a time period T1 in FIG. 3. In the current profile 320, the current consumption of the time period T0 is substantially identical to the current consumption of the time period T1 because in both time periods T0 and T1 both a bit "0" and a bit "1" are concurrently read. Specifically, due to the configuration of memory 200 in FIG. 2, the current consumption for reading a bit "0" from the main array and thus from the memory 200 matches the current consumption for reading a bit "1" from the same main array. Because the current consumption for reading a bit "1" or "0" from the main array (and thus from the memory 200) cannot be distinguished, hackers are prevented from obtaining read data by electrical probing. The data stored in the memory 200 is therefore secured.

Figure 4:
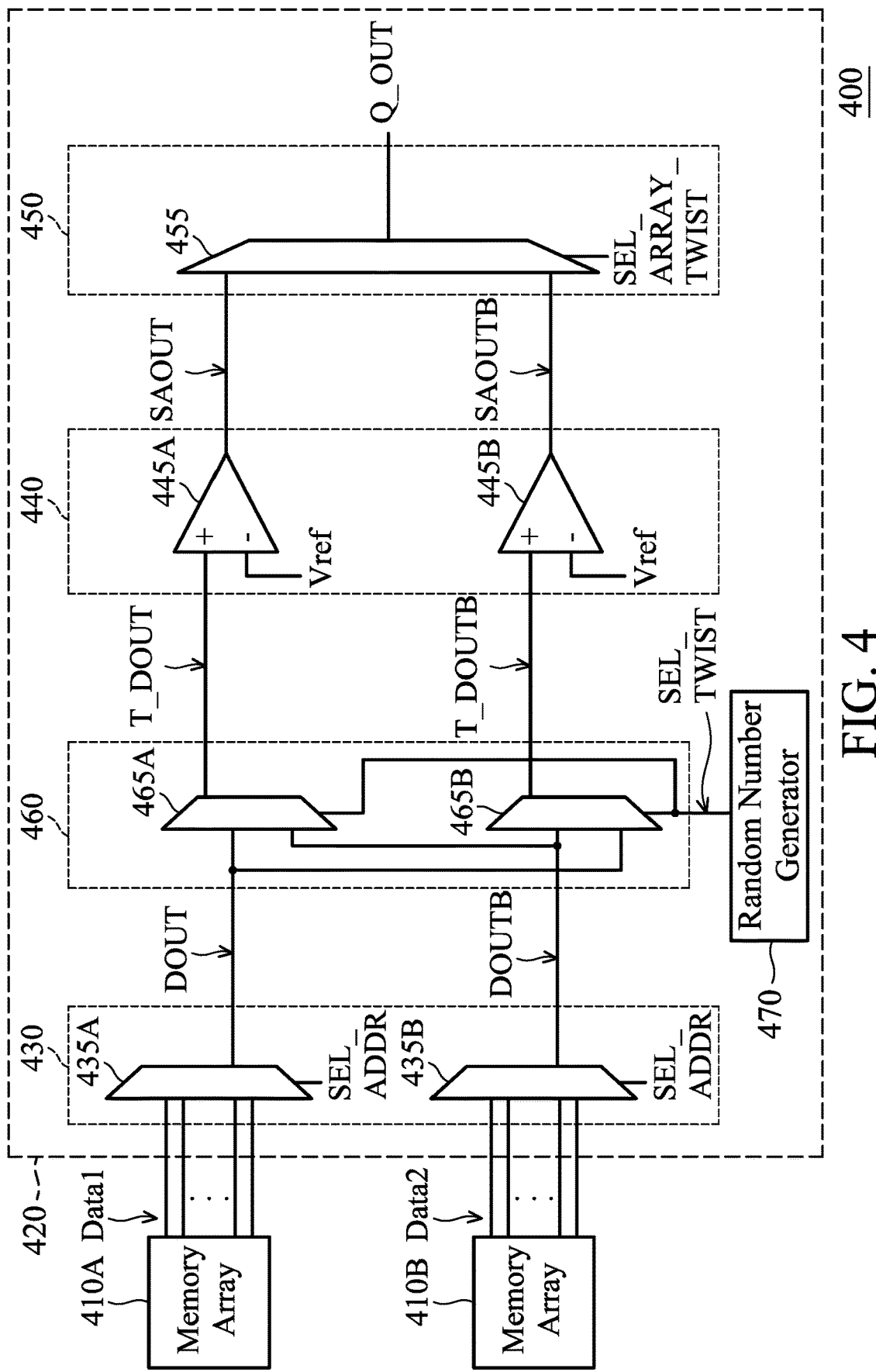
FIG. 4 shows a memory, in accordance with some embodiments of the disclosure.

FIG. 4 shows a memory 400 illustrating an exemplified block diagram of the memory 10 of FIG. 1, in accordance with some embodiments of the disclosure. The memory 400 is an embedded memory powered by a power supply VDD of the IC 100. Furthermore, the memory 400 may be a volatile memory or a non-volatile memory controlled by the controller 20 of the IC 100.

The memory 400 includes a memory array 410A, a memory array 410B and a read circuit 420. As described above, the memory array 410A is formed by a plurality of first memory cells disposed in rows and columns, and the memory array 410B is formed by a plurality of second memory cells disposed in rows and columns. In some embodiments, the number of first memory cells in the memory array 410A is identical to the number of second memory cells in the memory array 410B. Furthermore, one of the memory arrays 410A or 410B is a main array capable of storing main data, and the other memory array is an auxiliary array capable of storing complement data that is complementary to the main data.

The read circuit 420 is capable of simultaneously reading data from the memory array 410A and the memory array 410B in response to an access address signal ADDR (e.g. ADDR of FIG. 1) from the controller 20. The read circuit 420 includes a decoding circuit 430, a sensing circuit 440, an output buffer 450, a twist circuit 460 and a random number generator 470. Compared to read circuit 220 in FIG. 2, read circuit 420 includes a twist circuit 460 coupled between the decoding circuit 430 and the sensing circuit 440.

In response to an access address signal ADDR from a controller 20, the memory array 410A provides data Data1 corresponding to the access address signal ADDR to a decoder 435A of the decoding circuit 430, and the memory array 410B provides data Data2 corresponding to the access address signal ADDR to a decoder 435B of the decoding circuit 430. In some embodiments, the decoders 435A and 435B are selectors or multiplexers. It should be noted that the data Data1 stored in the memory array 410A is complementary to the data Data2 stored in the memory array 410B.

In response to an address signal SEL_ADDR corresponding to the access address signal ADDR from the controller 20, the decoder 435A selectively provides a signal DOUT of the data Data1 to the twist circuit 460. Simultaneously, the decoder 435B selectively provides a signal DOUTB of the data Data2 to the twist circuit 460. Similarly, the signal DOUT is complementary to the signal DOUTB. In some embodiments, the address signal SEL_ADDR is provided by the controller 20. In some embodiments, the address signal SEL_ADDR is provided by the other circuit (not shown) of the memory 400.

The twist circuit 460 includes a selector 465A and a selector 465B. The selector 465A is coupled to a sense amplifier 445A of the sensing circuit 440, and the selector 465B is coupled to a sense amplifier 445B of the sensing circuit 440. In response to a control signal SEL_TWIST from the random number generator 470, the selector 465A selectively couples the sense amplifier 445A to the decoder 435A or the decoder 435B, and the selector 465B selectively couples the sense amplifier 445B to another decoder (i.e. the decoder among the decoders 435A and 435B that has not been coupled to the sense amplifier 445A).

For example, if the control signal SEL_TWIST is at a first logic level, such as "0", the control signal SEL_TWIST controls the selector 465A to couple the sense amplifier 445A to the decoder 435A, and controls the selector 465B to couple the sense amplifier 445B to the decoder 435B. Thus, the selector 465A provides the signal DOUT from the decoder 435A as a signal T_DOUT to be provided to the sense amplifier 445A, and the selector 465B provides the signal DOUTB from the decoder 435B as a signal T_DOUTB to be provided to the sense amplifier 445B. Conversely, if the control signal SEL_TWIST is at a second logic level, such as "1", the control signal SEL_TWIST controls the selector 465A to couple the sense amplifier 445A to the decoder 435B, and controls the selector 465B to couple the sense amplifier 445B to the decoder 435A. Thus, the selector 465A provides the signal DOUTB from the decoder 435B as the signal T_DOUT to be provided to the sense amplifier 445A, and the selector 465B provides the signal DOUT from the decoder 435A as the signal T_DOUTB to be provided to the sense amplifier 445B. Therefore, the twist circuit 460 is capable of selectively providing the signals DOUT and DOUTB to the sense amplifiers 445A and 445B according to the control signal SEL_TWIST. It should be noted that the control signal SEL_TWIST has a random value provided by the random number generator 470. Specifically, the signals DOUT and DOUTB to be provided to the sense amplifiers 445A and 445B can be swapped randomly by the twist circuit 460.

In the sensing circuit 440, a voltage difference between the signal T_DOUT and a reference signal Vref is amplified by the sense amplifier 445A to provide a sensing signal SAOUT. Similarly, a voltage difference between the signal T_DOUTB and the reference signal Vref is amplified by the sense amplifier 445B to provide a sensing signal SAOUTB. Similarly, the sensing signal SAOUT is complementary to the sensing signal SAOUTB.

As described above, the sense amplifiers 445A and 445B have the same circuit and configuration. It should be noted that the sense amplifiers 445A and 445B are used as an example to illustrate simple schematic diagram, and is not meant to limit the disclosure. Any sense amplifier capable of amplifying a small difference in the voltage or current level of a bit line can be used in the sensing circuit 440.

The output buffer 450 includes a selector 455. The selector 455 is coupled to the sense amplifiers 445A and 445B of the sensing circuit 440. In response to a control signal SEL_ARRAY TWIST which indicates which memory array is a main array and whether the signals DOUT and DOUTB provided to the sense amplifiers 445A and 445B have been swapped, the selector 455 selectively provides the sensing signal SAOUT from the sense amplifier 445A or the sensing signal SAOUTB from the sense amplifier 445B as an output Q_OUT. In some embodiments, the control signal SEL_ARRAY TWIST is provided by the controller 20 of FIG. 1 according to the control signal SEL_TWIST. For example, according to the memory array being a main array and the control signal SEL_TWIST indicating whether the signals DOUT and DOUTB have been swapped by the twist circuit 460, the controller 20 can provide the control signal SEL_ARRAY TWIST, so as to correctly provide the data stored in the main array as the output Q_OUT. In some embodiments, the control signal SEL_ARRAY TWIST is provided by the random number generator 470 or the other circuit (not shown) of the memory 400. The description of the control signal SEL_ARRAY TWIST is illustrated below.

If the memory array 410A is a main array and the memory array 410B is an auxiliary array and the signals DOUT and DOUTB provided to the sense amplifiers 445A and 445B are not swapped by the twist circuit 460 (e.g. T_DOUT=DOUT, and T_DOUTB=DOUTB), the control signal SEL_ARRAY TWIST controls the selector 455 to provide the sensing signal SAOUT as the output Q_OUT.

If the memory array 410A is a main array and the memory array 410B is an auxiliary array and the signals DOUT and DOUTB provided to the sense amplifiers 445A and 445B have been swapped by the twist circuit 460 (e.g. T_DOUT=DOUTB, and T_DOUTB=DOUT), the control signal SEL_ARRAY TWIST controls the selector 455 to provide the sensing signal SAOUTB as the output Q_OUT.

If the memory array 410A is an auxiliary array and the memory array 410B is a main array and the signals DOUT and DOUTB provided to the sense amplifiers 445A and 445B are not swapped by the twist circuit 460 (e.g. T_DOUT=DOUT, and T_DOUTB=DOUTB), the control signal SEL_ARRAY TWIST controls the selector 455 to provide the sensing signal SAOUTB as the output Q_OUT.

If the memory array 410A is an auxiliary array and the memory array 410B is a main array and the signals DOUT and DOUTB provided to the sense amplifiers 445A and 445B have been swapped by the twist circuit 460 (e.g. T_DOUT=DOUTB, and T_DOUTB=DOUT), the control signal SEL_ARRAY TWIST controls the selector 455 to provide the sensing signal SAOUT as the output Q_OUT.

Figure 5:
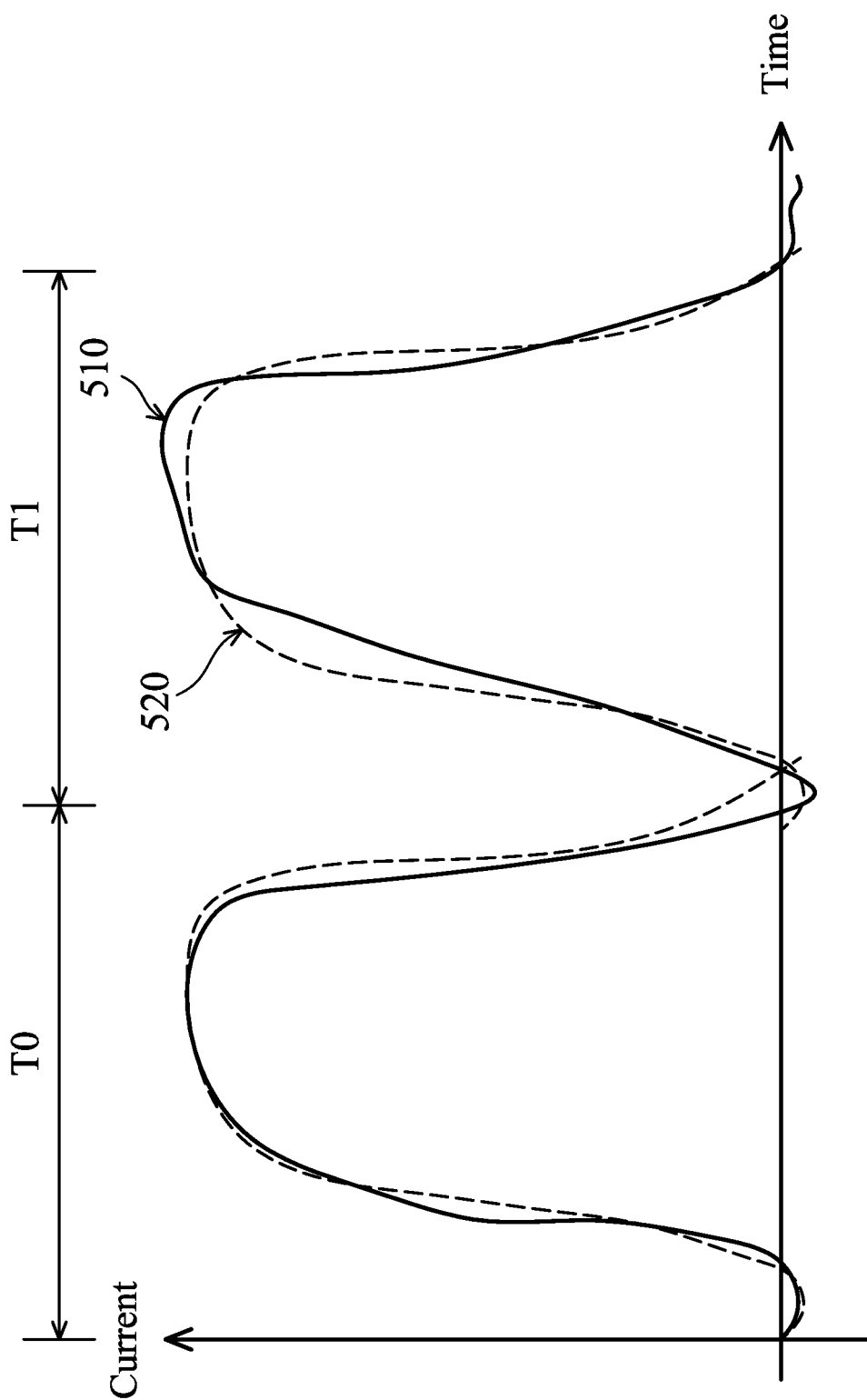
FIG. 5 shows an example diagram illustrating current consumption of the memory of FIG. 2 and current consumption of the memory of FIG. 4.

FIG. 5 shows an example diagram illustrating current consumption of the memory 200 of FIG. 2 and current consumption of the memory 400 of FIG. 4. As described above, the current consumed by of the memory 200 or 400 is based on the power supply VDD thereof. In FIG. 5, a current profile 510 and a current profile 520 are shown. The current profile 510 represents the current consumption of the memory 200 of FIG. 2, and the current profile 520 represents the current consumption of the memory 400 of FIG. 4. Furthermore, a bit "0" is read from a main array and a bit "1" is read from an auxiliary array in a time period T0, and a bit "1" is read from the main array and a bit "0" is read from the auxiliary array in a time period T1. Compared with the current profile 510 of memory 200 in FIG. 2, current consumption during time period T0 is more similar to current consumption during time period T1 in the current profile 520 for memory 400 in FIG. 4. Therefore, it is more difficult to obtain the read data by electrical probing of the power consumption of the memory 400. Specifically, by using the twist circuit 460 to randomly swap the inputs of the sense amplifiers 445A and 445B, the read bit "0" or "1" from the main array is randomly provided to the sense amplifier 445A or 445B. If mismatch of components in the sense amplifiers 445A and 445B is present, the read current of the sense amplifier 445A does not match the read current of the sense amplifier 445B for the same read bit "0" or "1". Read current mismatch caused by the mismatch of the components in the sense amplifiers 445A and 445B can be improved when the read bit "0" or "1" from the main array is randomly provided to the sense amplifier 445A or 445B via the twist circuit 460.

Figure 6:
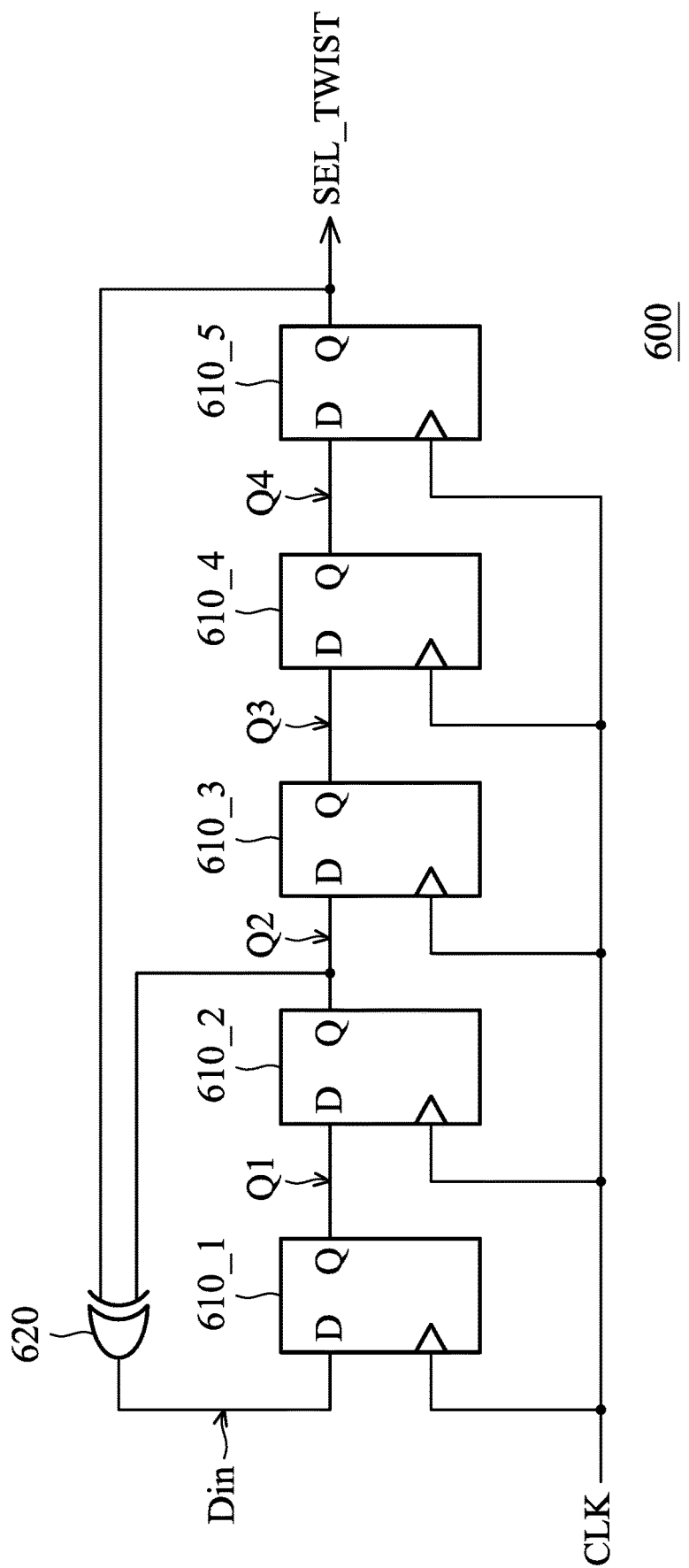
FIG. 6 shows a random number generator, in accordance with some embodiments of the disclosure.

FIG. 6 shows a random number generator 600 illustrating an exemplified block diagram of the random number generator 470 of FIG. 4, in accordance with some embodiments of the disclosure. The random number generator 600 is a 5-stage liner feedback shift register, and includes five flip-flops 610_1, 610_2, 610_3, 610_4 and 610_5 and a XOR gate 620. The flip-flops 610_1-610_5 coupled in serial form a shift register. For example, flip-flop 610_2 is coupled between flip-flops 610_1 and 610_3, and flip-flop 610_2 has an input terminal D coupled to an output terminal Q of flip-flop 610_1 and an output terminal Q coupled to an input terminal D of flip-flop 610_3. Thus, in response to a clock signal CLK, flip-flop 610_2 is capable of providing a signal Q2 to flip-flop 610_3 according to a signal Q1 from flip-flop 610_1. Furthermore, the XOR gate 620 is capable of providing a signal Din to flip-flop 610_1 according to the signal Q2 provided by flip-flop 610_2 and an output signal SEL_TWIST from flip-flop 610_5. Specifically, the output signal of each flip-flop is shifted to the next flip-flop in response to the clock signal CLK, and then a 1-bit pseudo random control signal SEL_TWIST is generated according to the signal Din, so as to control all the selectors of a twist circuit (e.g. the twist circuit 460 of FIG. 4) in a memory. The random number generator 600 is used as an example, and not to limit the disclosure. Other number generators capable of generating a random signal can be used to provide the output signal SEL_TWIST.

Figure 7:
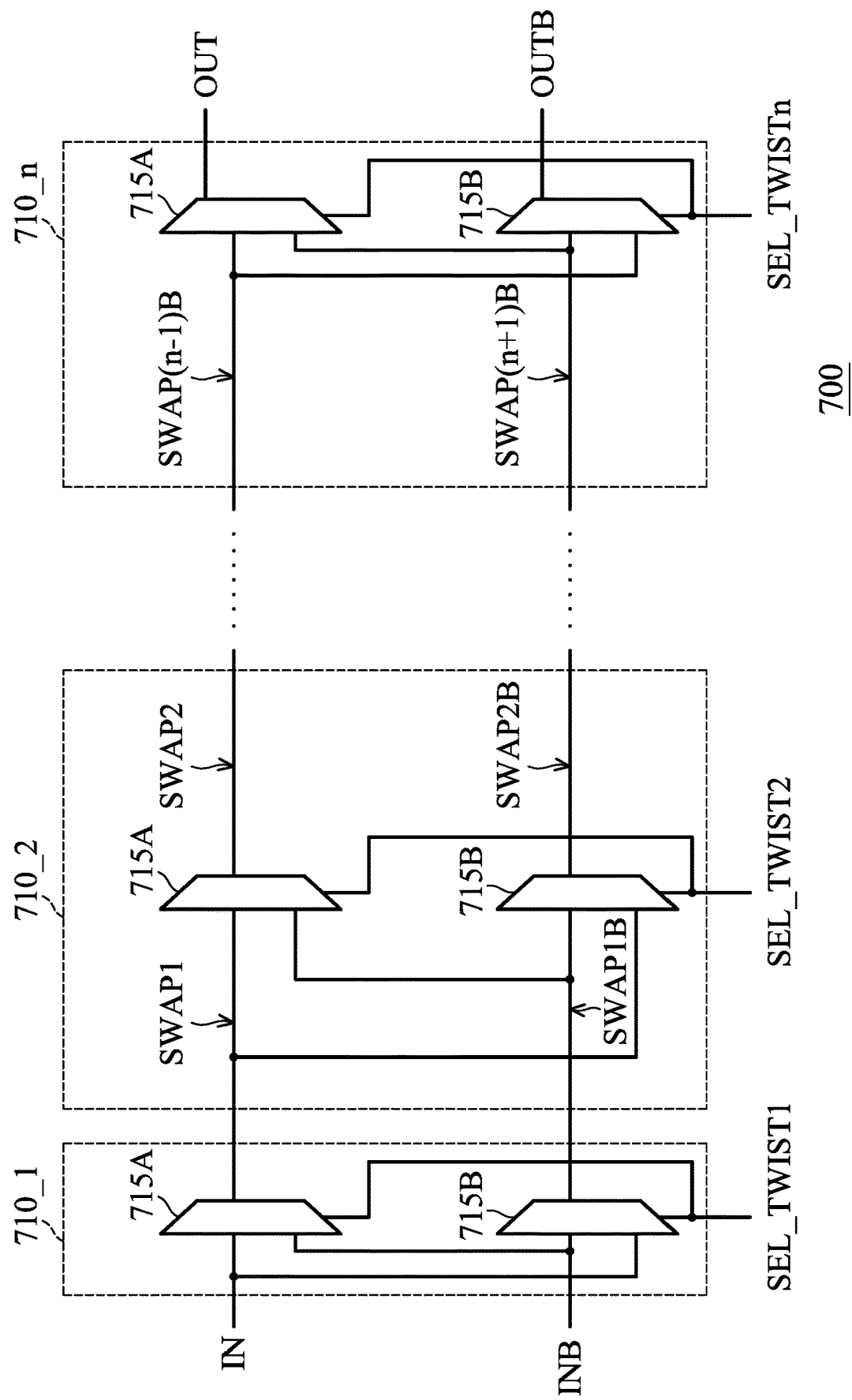
FIG. 7 shows a twist circuit, in accordance with some embodiments of the disclosure.

FIG. 7 shows a twist circuit 700, in accordance with some embodiments of the disclosure. The twist circuit 700 includes a plurality of exchange units 710_1-710_n. Each exchange unit includes a pair of selectors 715A and 715B. Each of the exchange units 710_1-710_n is capable of receiving a pair of input signals to provide a pair of output signals, and a control signal (e.g. SEL_TWIST1-SEL_TWISTn) is used to control whether the output signals are swapped. The twist circuit 700 is capable of receiving a pair of input signals IN and INB (e.g. DOUT and DOUTB of FIG. 4) to provide a pair of output signals OUT and OUTB (e.g. T_DOUT and T_DOUTB of FIG. 4). Furthermore, whether the output signals OUT and OUTB are swapped is determined according to the operations of the exchange units 710_1-710_n.

In the twist circuit 700, the exchange units 710_1-710_n are coupled in serial. In each exchange unit, the selectors 715A and 715B are controlled by the same control signal. In some embodiments, the selectors 715A and 715B are multiplexers. Taking the exchange unit 710_1 as an example, a control signal SEL_TWIST1 controls the selector 715A to selectively provide one of the signals IN and INB as a signal SWAP1. Simultaneously, the control signal SEL_TWIST1 controls the selector 715B of the exchange unit 710_1 to selectively provide the other signal as a signal SWAP1B. For example, if the control signal SEL_TWIST1 is at a first logic level, such as "0", the control signal SEL_TWIST1 controls the selector 715A to provide the input IN as the signal SWAP1, and controls the selector 715B to provide the input INB as the signal SWAP1B. Conversely, if the control signal SEL_TWIST1 is at a second logic level, such as "1", the control signal SEL_TWIST1 controls the selector 715A to provide the signal INB as the signal SWAP1, and controls the selector 715B to provide the input IN as the signal SWAP1B. Therefore, the signals IN and INB provided to the exchange unit 710_2 can be swapped by the exchange unit 710_1.

As described above, each of the control signals SEL_TWIST1-SEL_TWISTn is a 1-bit pseudo random control signal. In some embodiment, the control signals SEL_TWIST1-SEL_TWISTn are the same or correlated. In some embodiments, each of control signals SEL_TWIST1-SEL_TWISTn is provided by an individual random number generator, and the control signals SEL_TWIST1-SEL_TWISTn are uncorrelated with each other.

Figure 8:
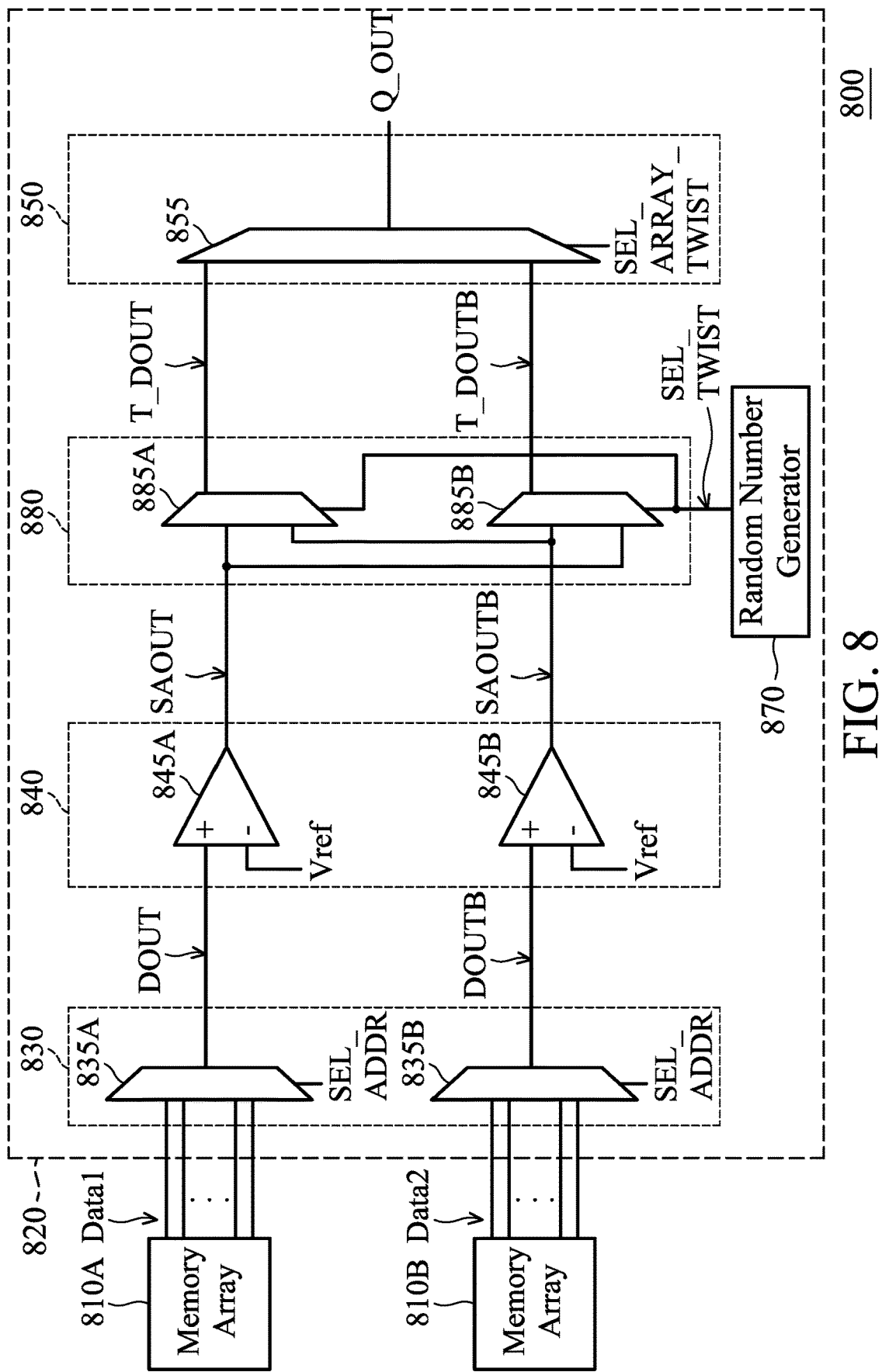
FIG. 8 shows a memory, in accordance with some embodiments of the disclosure.

FIG. 8 shows a memory 800 illustrating an exemplified block diagram of the memory 10 of FIG. 1, in accordance with some embodiments of the disclosure. The memory 800 is an embedded memory powered by a power supply VDD for the IC 100. Furthermore, the memory 800 may be a volatile memory or a non-volatile memory controlled by the controller 20.

The memory 800 includes a memory array 810A, a memory array 810B and a read circuit 820. In some embodiments, the number of memory cells in the memory array 810A is identical to the number of memory cells in the memory array 810B. Furthermore, one of the memory arrays 810A or 810B is a main array capable of storing main data, and the other memory array is an auxiliary array capable of storing complement data that is complementary to the main data.

The read circuit 820 is capable of simultaneously reading data from the memory array 810A and the memory array 810B in response to an access address signal ADDR (e.g. ADDR of FIG. 1) from the controller 20. The read circuit 820 includes a decoding circuit 830, a sensing circuit 840, an output buffer 850, a twist circuit 880 and a random number generator 870. Compared to read circuit 220 in FIG. 2, read circuit 820 includes a twist circuit 880 coupled between the sensing circuit 840 and the output buffer 850.

In the decoding circuit 830, in response to an address signal SEL_ADDR corresponding to an access address signal ADDR from the controller 20, a decoder 835A selectively provides a signal DOUT of data Data1 to the sensing circuit 840. Simultaneously, a decoder 835B also selectively provides a signal DOUTB of data Data2 to the sensing circuit 840. As described above, the data Data1 corresponding to the access address signal ADDR is complementary to the data Data2 corresponding to the access address signal ADDR. Similarly, the signal DOUT is complementary to the signal DOUTB. In some embodiments, the address signal SEL_ADDR is provided by the controller 20. In some embodiments, the address signal SEL_ADDR is provided by the other circuit (not shown) of the memory 800.

The sensing circuit 840 includes a sense amplifier 845A and a sense amplifier 845B. A voltage difference between the signal DOUT and a reference signal Vref is amplified by the sense amplifier 845A to provide a sensing signal SAOUT to the twist circuit 880. Similarly, a voltage difference between the signal DOUTB and the reference signal Vref is amplified by the sense amplifier 845B to provide a sensing signal SAOUTB to the twist circuit 880. As described above, the sensing signal SAOUT is complementary to the sensing signal SAOUTB.

In the sensing circuit 840, the sense amplifiers 845A and 845B have the same circuit and configuration. It should be noted that the sense amplifiers 845A and 845B are used as an example to illustrate simple schematic diagram, and are not meant to limit the disclosure. Any sense amplifier capable of amplifying a small difference in voltage or current level of bit line can be used in the sensing circuit 840.

The twist circuit 880 includes a pair of selectors 885A and 885B. In response to a control signal SEL_TWIST from the random number generator 870, the selector 865A selectively provides one of the sensing signals SAOUT or SAOUTB as a signal T_DOUT, and provides the signal T_DOUT to the output buffer 850. Simultaneously, the selector 885B selectively provides the other sensing signal as a signal T_DOUTB, and provides the signal T_DOUTB to the output buffer 850.

For example, if the control signal SEL_TWIST is at a first logic level, such as "0", the control signal SEL_TWIST controls the selector 885A to provide the sensing signal SAOUT as the signal T_DOUT, and controls the selector 885B to provide the sensing signal SAOUTB as the signal T_DOUTB. Conversely, if the control signal SEL_TWIST is at a second logic level, such as "1", the control signal SEL_TWIST controls the selector 885A to provide the sensing signal SAOUTB as the signal T_DOUT, and controls the selector 885B to provide the sensing signal SAOUT as the signal T_DOUTB.

As described above, the control signal SEL_TWIST has a random value provided by the random number generator 870. Furthermore, the sensing signals SAOUT and SAOUTB provided to the output buffer 850 can be swapped randomly by the twist circuit 880.

The output buffer 850 includes a selector 855. In response to a control signal SEL_ARRAY TWIST which indicates which memory array is a main array and whether the sensing signals SAOUT and SAOUTB have been swapped, the selector 855 selectively provides the signal T_DOUT from the selector 885A or the signal T_DOUTB from the selector 885B as an output Q_OUT. In some embodiments, the control signal SEL_ARRAY TWIST is provided by the controller 20 according to the control signal SEL_TWIST. In some embodiments, the control signal SEL_ARRAY TWIST is provided by the random number generator 870 or the other circuit (not shown) of the memory 800.

If the memory array 810A is a main array and the memory array 810B is an auxiliary array and the sensing signals SAOUT and SAOUTB are not swapped by the twist circuit 880 (e.g. T_DOUT=SAOUT, and T_DOUTB=SAOUTB), the control signal SEL_ARRAY TWIST controls the selector 855 to provide the signal T_DOUT as the output Q_OUT.

If the memory array 810A is a main array and the memory array 810B is an auxiliary array and the sensing signals SAOUT and SAOUTB have been swapped by the twist circuit 880 (e.g. T_DOUT=SAOUTB, and T_DOUTB=SAOUT), the control signal SEL_ARRAY TWIST controls the selector 855 to provide the signal T_DOUTB as the output Q_OUT.

If the memory array 810A is an auxiliary array and the memory array 810B is a main array and the sensing signals SAOUT and SAOUTB are not swapped by the twist circuit 880 (e.g. T_DOUT=SAOUT, and T_DOUTB=SAOUTB), the control signal SEL_ARRAY TWIST controls the selector 855 to provide the signal T_DOUTB as the output Q_OUT.

If the memory array 810A is an auxiliary array and the memory array 810B is a main array and the sensing signals SAOUT and SAOUTB have been swapped by the twist circuit 880 (e.g. T_DOUT=SAOUTB, and T_DOUTB=SAOUT), the control signal SEL_ARRAY TWIST controls the selector 855 to provide the signal T_DOUT as the output Q_OUT.

Similarly, by using the twist circuit 880 to randomly swap the outputs of the sense amplifiers 845A and 845B, read current mismatch caused by different sense amplifiers 845A and 845B can be avoided.

In some embodiments, the memory 800 includes another twist circuit between the decoding circuit 830 and the sensing circuit 840, such as the twist circuit 460 of FIG. 4, so as to swap the signals DOUT and DOUTB provided to the sense amplifiers 845A and 845B randomly.

In some embodiments, each memory of the embodiments of the disclosure further includes a writing circuit. In the memory, the writing circuit is capable of storing the programming data to a main array and an auxiliary array in response to an access address signal ADDR. It should be noted that the programming data to be stored into the main array is complementary to the programming data to be stored into the auxiliary array.

Figure 9:
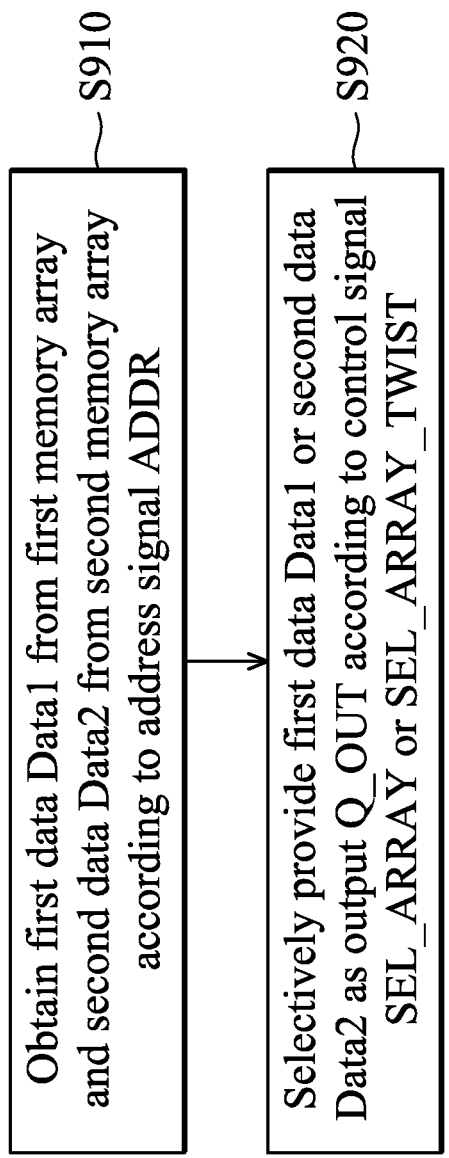
FIG. 9 shows a flow chart illustrating a read method of a memory, in accordance with some embodiments of the disclosure.

FIG. 9 shows a flow chart illustrating a read method of a memory (e.g., 100 of FIG. 1, 200 of FIG. 2, 400 of FIG. 4, and 800 of FIG. 8), in accordance with some embodiments of the disclosure. As described above, the memory includes a first memory array (e.g., 210A of FIG. 2, 410A of FIG. 4, and 810A of FIG. 4) and a second memory array (e.g., 210B of FIG. 2, 410B of FIG. 4, and 810B of FIG. 4), and one of the first and second memory arrays is a main array, and the other memory array is an auxiliary array.

In operation S910, in response to an address signal ADDR, the first data Data1 is obtained from the first memory array and the second data Data2 is obtained from the second memory array. As described above, the first data Data1 is complementary to the second data Data2.

In operation S920, the first data Data1 or the second data Data2 is selectively provided as an output Q_OUT according to a control signal SEL_ARRAY or SEL_ARRAY TWIST, and the control signal SEL_ARRAY or SEL_ARRAY TWIST indicates which memory array is a main array.

In some embodiments, an output buffer (e.g., 250 of FIG. 2, 450 of FIG. 4 and 850 of FIG. 8) of the memory includes a selector capable of selectively provides the sensing signal SAOUT or the sensing signal SAOUTB as the output Q_OUT ccording to the control signal SEL_ARRAY or SEL_ARRAY TWIST. A sensing circuit (e.g., 240 of FIG. 2, 440 of FIG. 4 and 840 of FIG. 8) of the memory is capable of providing the sensing signals SAOUT and SAOUTB according to the first data Data1 and the second data Data2.

In some embodiments, a twist circuit (e.g., 880 of FIG. 8) is capable of randomly swapping the sensing signal SAOUT and the sensing signal SAOUTB to be provided to the output buffer. In some embodiments, a twist circuit (e.g., 460 of FIG. 4) is capable of randomly swapping the first data Data1 and the second data Data2 to be provided to the sensing circuit.

Embodiments for memories with symmetric read current profiles are provided. A first memory array is used to store main data and a second memory array is used to store complement data that is complementary to the main data. By simultaneously reading the first memory array and the second memory array to obtain the main data, a symmetric read current profile is obtained. Therefore, when the main data is read, the complement data is also read, and it is difficult to reverse the read data by electrical probing the power consumption of the memory. Furthermore, by randomly swapping the signals corresponding to the main data and the complement data to be provided to the sense amplifiers, read current mismatch caused by different sense amplifiers can be improved. Moreover, by randomly swapping the signals provided by the sense amplifiers corresponding to the main data and the complement data, read current mismatch caused by different sense amplifiers can also be improved. According to the embodiments, the data stored in the first and second memory array is difficult to obtain by hackers by various electrical means, and the stored data is protected. In some embodiments, the stored data includes information regarding identification (ID) codes, secret data, fingerprint codes, and so on.

In some embodiments, a memory with a symmetric read current profile is provided. The memory includes a first memory array, a second memory array, and a read circuit. The first memory array is configured to store main data. The second memory array is configured to store complement data that is complementary to the main data. The read circuit includes a first sense amplifier, a second sense amplifier and an output buffer. The first sense amplifier is configured to provide a first sensing signal according to a reference signal and first data of the main data corresponding to a first address signal. The second sense amplifier is configured to provide a second sensing signal according to the reference signal and second data of the complement data corresponding to the first address signal. The output buffer is configured to provide one of the first sensing signal and the second sensing signal as an output according to a control signal.

In some embodiments, a memory with symmetric read current profile is provided. The memory includes a first memory array, a second memory array and a read circuit. The first memory array is configured to store main data. The second memory array is configured to store complement data that is complementary to the main data. The read circuit includes a sensing circuit, a twist circuit, a random number generator and an output buffer. The sensing circuit is configured to provide a first sensing signal according to a reference signal and a first signal, and a second sensing signal according to the reference signal and a second signal. The twist circuit is configured to selectively provide one of first data of the main data corresponding to a first address signal and second data of the complement data corresponding to the first address signal as the first signal and selectively provide the other as the second signal according to a first control signal. The random number generator is configured to generate the first control signal and a second control signal. The output buffer is configured to selectively provide the first sensing signal or the second sensing signal as an output according to the second control signal.

In some embodiments, a read method for a memory is provided. Main data is stored into a first memory array and complement data is stored into a second memory array of the memory. The complement data is complementary to the main data. First data is obtained from the first memory array and second data is obtained from the second memory array according an address signal. The first data and the second data are exchanged in response to a random signal. The exchanged first data or the exchanged second data is selectively provided as an output according to a control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory, comprising:
   a first memory array configured to store main data;
   a second memory array configured to store complement data that is complementary to the main data; and
   a read circuit, comprising:
      a first sense amplifier configured to provide a first sensing signal according to a reference signal and first data of the main data corresponding to a first address signal;
      a second sense amplifier configured to provide a second sensing signal according to the reference signal and second data of the complement data corresponding to the first address signal; and
      an output buffer configured to provide one of the first sensing signal and the second sensing signal as an output according to a control signal.

2. The memory as claimed in claim 1, wherein the first sense amplifier is coupled between the first memory array and the output buffer, and the second sense amplifier is coupled between the second memory array and the output buffer.

3. The memory as claimed in claim 1, wherein the output buffer comprises:
   a first selector coupled to the first sense amplifier and the second sense amplifier, and configured to selectively provide the first sensing signal or the second sensing signal as the output according to the control signal.

4. The memory as claimed in claim 1, further comprising:
   a first decoder coupled between the first memory array and the first sense amplifier, and configured to selectively provide a signal of the first data to the first sense amplifier according to the first address signal; and
   a second decoder coupled between the second memory array and the second sense amplifier, and configured to selectively provide a signal of the second data to the second sense amplifier according to the first address signal.

5. The memory as claimed in claim 1, further comprising:
   a writing circuit configured to store first programming data to the first memory array according to a second address signal and to store second programming data to the second memory array according to the second address signal,
   wherein binary representation of the first programming data is complementary to that of the second programming data.

6. The memory as claimed in claim 1, wherein the read circuit further comprises:
   an exchange unit configured to selectively provide one of the first sensing signal and the second sensing signal as a first signal and selectively provide the other as a second signal according to the control signal,
   wherein the output buffer is coupled to the exchange unit and configured to selectively provide the first signal or the second signal as the output according to the control signal.

7. The memory as claimed in claim 1, wherein when the first memory array is a main array and the second memory array is an auxiliary array, the control signal controls the output buffer to provide the first data as the output, and when the first memory array is an auxiliary array and the second memory array is a main array, the control signal controls the output buffer to provide the second data as the output.

8. A memory, comprising:
   a first memory array configured to store main data;
   a second memory array configured to store complement data that is complementary to the main data; and
   a read circuit, comprising:
      a sensing circuit configured to provide a first sensing signal according to a reference signal and a first signal, and a second sensing signal according to the reference signal and a second signal;
      a twist circuit configured to selectively provide one of first data of the main data corresponding to a first address signal and second data of the complement data corresponding to the first address signal as the first signal and selectively provide the other as the second signal according to a first control signal;
      a random number generator configured to generate the first control signal and a second control signal; and
      an output buffer configured to selectively provide the first sensing signal or the second sensing signal as an output according to the second control signal.

9. The memory as claimed in claim 8, wherein the read circuit further comprises:
   a first decoder coupled between the first memory array and the twist circuit configured to provide the first data from the first memory array according the first address signal; and
   a second decoder coupled between the second memory array and the twist circuit configured to provide the second data from the second memory array according the first address signal.

10. The memory as claimed in claim 9, wherein the first decoder comprises:
    a first selector coupled between the first memory array and the twist circuit, and configured to selectively provide a signal of the first data stored in the first memory array to the twist circuit according to the first address signal,
    wherein the second decoder comprises:
       a second selector coupled between the second memory array and the twist circuit, and configured to selectively provide a signal of the second data stored in the second memory array to the twist circuit according to the first address signal,
    wherein the signal of the first data stored in the first memory array is complementary to the signal of the second data stored in the second memory array.

11. The memory as claimed in claim 8, wherein the twist circuit comprises:
    a third selector configured to selectively provide one of the first data and the second data as the first signal according to the first control signal; and
    a fourth selector configured to selectively provide the other data of the first data and the second data as the second signal according to the first control signal.

12. The memory as claimed in claim 8, further comprising:
    a writing circuit configured to store first programming data to the first memory array according to a second address signal and to store second programming data to the second memory array according to the second address signal,
    wherein binary representation of the first programming data is complementary to that of the second programming data.

13. The memory as claimed in claim 8, wherein the number of memory cells in the first memory array is identical to the number of memory cells in the second memory array.

14. The memory as claimed in claim 8, wherein the first control signal controls the twist circuit to provide the first data as the second signal and provide the second data as the first signal, wherein when the first memory array is a main array and the second memory array is an auxiliary array, the second control signal controls the output buffer to provide the second sensing signal as the output, and when the first memory array is an auxiliary array and the second memory array is a main array, the second control signal controls the output buffer to provide the first sensing signal as the output.

15. A read method for a memory, comprising:
  storing main data into a first memory array and complement data into a second memory array of the memory, wherein the complement data is complementary to the main data;
  obtaining first data from the first memory array and second data from the second memory array according an address signal;
  exchanging the first data and the second data in response to a random signal; and
  selectively providing the exchanged first data or the exchanged second data as an output according to a control signal.

16. The method as claimed in claim 15, further comprising:
  selectively providing one of a first sensing signal corresponding to the exchanged first data and a second sensing signal corresponding to the exchanged second data as a first signal and selectively provide the other as a second signal according to the control signal,
  wherein the first signal or the second signal is provided as the output according to the control signal.

17. The method as claimed in claim 15, wherein the number of memory cells in the first memory array is identical to the number of memory cells in the second memory array.

18. The method as claimed in claim 15, wherein a read circuit of the memory comprises:
  a first decoder coupled to the first memory array and configured to obtain the first data from the first memory array according the address signal;
  a second decoder coupled to the second memory array and configured to obtain the second data from the second memory array according the address signal; and
  an output buffer configured to selectively provide the exchanged first data or the exchanged second data as the output according to the control signal.

19. The method as claimed in claim 18, wherein the read circuit of the memory further comprising:
  a first sense amplifier coupled between the first decoder and the output buffer, and configured to provide a first sensing signal according to a reference signal and the exchanged first data; and
  a second sense amplifier coupled between the second decoder and the output buffer, and configured to provide a second sensing signal according to the reference signal and the exchanged second data.

20. The method as claimed in claim 19, wherein the output buffer comprises:
  a selector coupled to the first sense amplifier and the second sense amplifier, and configured to selectively provide the first sensing signal or the second sensing signal as the output according to the control signal.

* * * * *